US010777667B2

United States Patent
Kurokawa et al.

(10) Patent No.: US 10,777,667 B2
(45) Date of Patent: Sep. 15, 2020

(54) SEMICONDUCTOR DEVICE (71) Applicant: Murata Manufacturing Co., Ltd., Kyoto-fu (JP)

(72) Inventors: Atsushi Kurokawa, Nagaokakyo (JP); Koshi Himeda, Nagaokakyo (JP); Kazuya Kobayashi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/681,640

(22) Filed: Nov. 12, 2019

(65) Prior Publication Data

US 2020/0168725 A1  May 28, 2020

(30) Foreign Application Priority Data

Nov. 26, 2018  (JP) .................. 2018-220103

(51) Int. Cl.
*H01L 29/73* (2006.01)
*H01L 29/732* (2006.01)
*H01L 23/31* (2006.01)
*H01L 23/00* (2006.01)
*H01L 29/417* (2006.01)

(52) U.S. Cl.
CPC ...... *H01L 29/7302* (2013.01); *H01L 23/3178* (2013.01); *H01L 24/13* (2013.01); *H01L 29/41708* (2013.01); *H01L 29/7325* (2013.01); *H01L 2924/1305* (2013.01)

(58) Field of Classification Search
None
See application file for complete search history.

(56) References Cited

U.S. PATENT DOCUMENTS

2016/0315060 A1 * 10/2016 Umemoto ............... H01L 24/05

FOREIGN PATENT DOCUMENTS

| JP | 2016-103540 A | 6/2016 |
|---|---|---|
| WO | 2015104967 A1 | 7/2015 |

* cited by examiner

*Primary Examiner* — Thien F Tran
(74) *Attorney, Agent, or Firm* — Studebaker & Brackett PC (57) ABSTRACT A semiconductor device has bipolar transistors on a substrate. There is also an insulating film on the substrate, covering the bipolar transistors. On this insulating film is emitter wiring, sticking through openings in the insulating film (first openings) to be electrically coupled to the emitter layer of the bipolar transistors. On the emitter wiring is a protective film. On the protective film is a bump, sticking through an opening in the protective film (second opening) to be electrically coupled to the emitter wiring. In plan view, the second opening is included in the area that is inside the bump and outside the first openings.

20 Claims, 14 Drawing Sheets

SEMICONDUCTOR DEVICE

CROSS-REFERENCE TO RELATED APPLICATION

This application claims benefit of priority to Japanese Patent Application No. 2018-220103, filed Nov. 26, 2018, the entire content of which is incorporated herein by reference.

BACKGROUND

Technical Field

The present disclosure relates to a semiconductor device.

Background Art

A power amplifier of mobile communication devices, such as cellular phones, uses heterojunction bipolar transistors (HBTs) as an amplifier element. In the mounting of a semiconductor chip including HBTs on a module substrate, a possible method is flip-chip bonding. The semiconductor device disclosed in Japanese Unexamined Patent Application Publication No. 2016-103540 has a bump on the emitter of multiple HBTs. The bump provides a pathway for heat dissipation, through which the heat generated by the HBTs escapes to the module substrate.

There is an insulating film between the emitter electrode of the HBTs and emitter wiring, and this insulating film has a first opening to allow for a connection between the emitter electrodes and wiring. Likewise, there is a protective film between the emitter wiring and the bump, and this protective film has a second opening to allow for a connection between the emitter wiring and the bump. In the semiconductor device disclosed in Japanese Unexamined Patent Application Publication No. 2016-103540, the first and second openings partially overlap in plan view.

A bump typically includes the three layers of an under-bump metal layer, for example made of a high-melting metal, a metal post, and a solder layer. In the process of flip-chip bonding, molten solder can penetrate between the under-bump metal layer and the metal post and come immediately above the first opening. The under-bump metal layer, moreover, may have a crack caused by the height gap along the edge of the first opening. The solder that reaches immediately above the first opening reaches the emitter of an HBT through this crack. This can cause damage to or the destruction of the HBT.

SUMMARY

Accordingly, the present disclosure provides a semiconductor device that has a bump but with reduced risk for damage to or the destruction of transistor(s) from solder on the bump.

According to preferred embodiments of the present disclosure, a semiconductor device has a substrate; a bipolar transistor on the substrate, the bipolar transistor including a stack of a collector layer, a base layer, and an emitter layer; an insulating film on the substrate, the insulating film covering the bipolar transistor; emitter wiring on the insulating film, the emitter wiring sticking through a first opening, an opening present in the insulating film, to be electrically coupled to the emitter layer; a protective film on the emitter wiring; and a bump on the protective film, the bump sticking through at least one second opening, an opening or openings present in the protective film, to be electrically coupled to the emitter wiring. In plan view, the second opening is included in the area that is inside the bump and outside the first opening.

By virtue of the second opening being outside the first opening in plan view, solder that penetrates into the bump is unlikely to reach the first opening even if it runs through a crack in the bump caused by the edge of the second opening. As a result, the damage to or destruction of the transistor caused by the solder on the bump is reduced.

Other features, elements, characteristics and advantages of the present disclosure will become more apparent from the following detailed description of preferred embodiments of the present disclosure with reference to the attached drawings.

DETAILED DESCRIPTION

Embodiment 1

Figure 1:
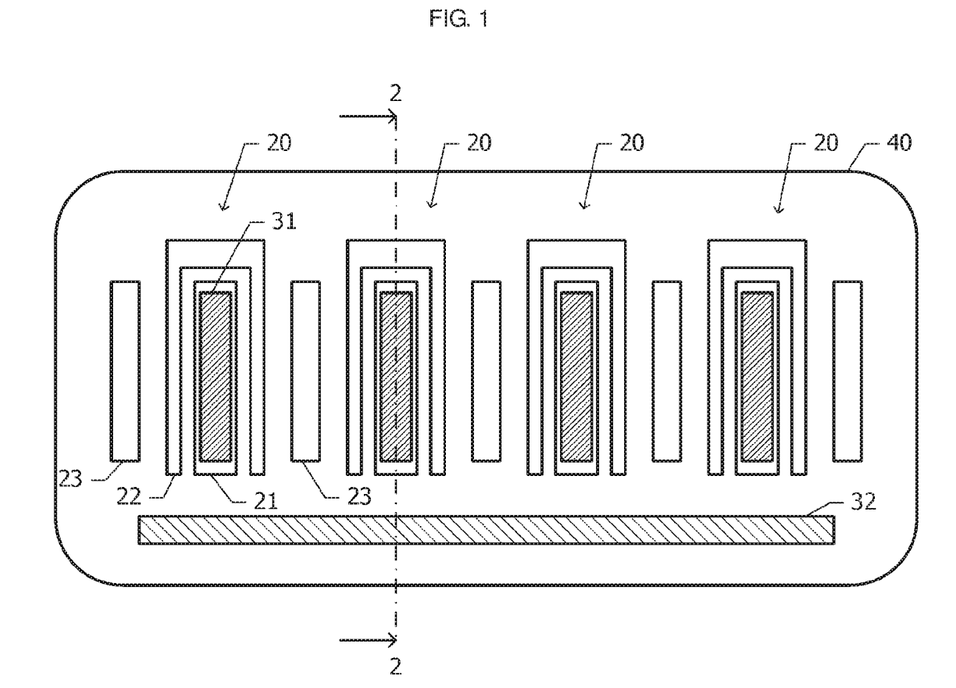
FIG. 1 illustrates the relative positions in plan view of electrodes, a bump, and openings in an insulating film in a semiconductor device according to Embodiment 1.
Figure 2:
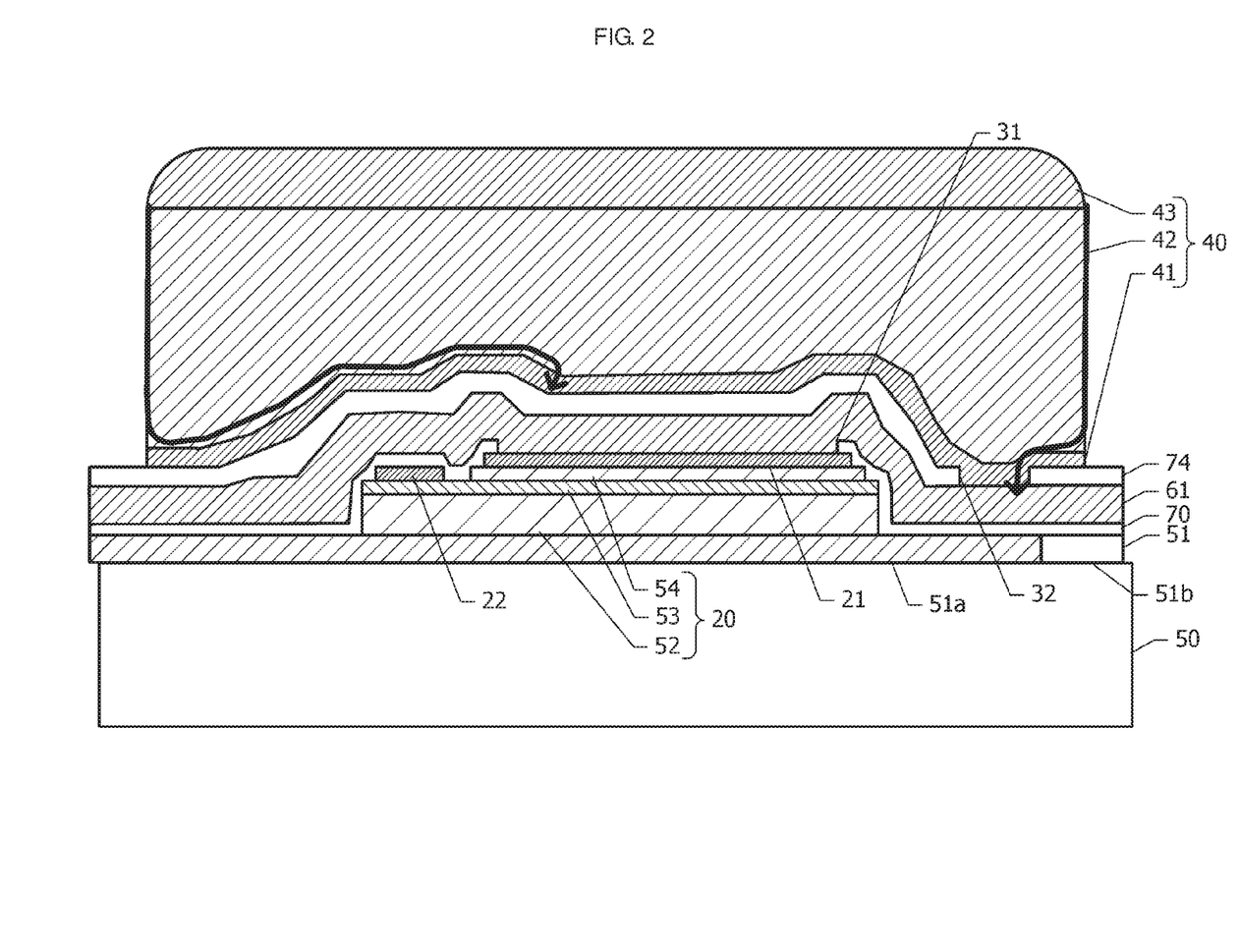
FIG. 2 is a cross-section along dash-dot line II-II in FIG. 1.

The following describes a semiconductor device according to Embodiment 1 with reference to FIGS. 1 and 2.

FIG. 1 illustrates the relative positions in plan view of electrodes, a bump, and openings in an insulating film in a semiconductor device according to Embodiment 1. The device has multiple, for example four, heterojunction bipolar transistors (HBTs) 20 arranged in a row (horizontal in FIG. 1). The direction in which the multiple HBTs 20 are arranged is herein referred to as "the direction of arrangement."

To the emitter, base, and collector of each HBT 20, an emitter electrode 21, a base electrode 22, and a collector electrode 23, respectively, are electrically coupled. The emitter electrode 21 is substantially rectangular in plan view, longer in the direction perpendicular to the direction of arrangement of the HBTs 20. The base electrode 22, in plan view, is surrounding the emitter electrode 21 substantially like a letter U opening perpendicular to the direction of arrangement. On each side of the base electrode 22 in the direction of arrangement is a collector electrode 23. Each pair of adjacent HBTs 20 share the collector electrode 23 therebetween.

An insulating film covering the HBTs 20 has first openings 31 corresponding to the emitter electrodes 21. In FIG. 1, the first openings 31 are shaded. In plan view, the first openings 31 are enclosed in the emitter electrodes 21. The first openings 31 provide a pathway for the emitter electrodes 21 to be electrically coupled to emitter wiring. A protective film covering the emitter wiring has a second opening 32. In FIG. 1, the second opening 32 is shaded lighter than the first openings 31. The second opening 32, in plan view, does not overlap the first openings 31 and is longer in the direction of arrangement.

The device also has a bump 40, and the HBTs 20 and the second opening 32 are enclosed in the bump 40 in plan view. The bump 40 is sticking through the second opening 32 to be electrically coupled to the emitter wiring underneath. In other words, the second opening 32 in plan view is included in the area that is inside the bump 40 and outside the first openings 31.

FIG. 2 is a cross-section along dash-dot line II-II in FIG. 1. The device has a substrate 50 made of a compound semiconductor, such as GaAs, and a subcollector layer 51 on it. Part of the subcollector layer 51 is insulating as a result of ion implantation. The subcollector layer 51 therefore has an electrically conductive element formation region 51*a* and an insulating element isolation region 51*b*.

The HBTs 20 are on part of the element formation region 51*a* of the subcollector layer 51. Each HBT 20 includes a substantially mesa-shaped portion formed by an n-type collector layer 52, a p-type base layer 53, and an n-type emitter layer 54. On the emitter layer 54 is an emitter electrode 21, forming an ohmic connection between the emitter electrode 21 and the emitter layer 54. On the base layer 53 is a base electrode 22, forming an ohmic connection between the base electrode 22 and the base layer 53. The collector electrodes 23 (FIG. 1) are on the element formation region 51*a*, and each collector electrode 23 forms an ohmic contact with the collector layer 52 with the element formation region 51*a* interposed therebetween.

An insulating film 70 covers the subcollector layer 51, collector layer 52, base layer 53, emitter layer 54, emitter electrodes 21, and base electrodes 22. The first openings 31 are in this insulating film 70. In plan view, the first openings 31 are enclosed in the emitter electrodes 21. On the insulating film 70 is emitter wiring 61. The emitter wiring 61 is sticking through the first openings 31 to be electrically coupled to the emitter electrodes 21. The emitter wiring 61 is made of, for example, gold (Au).

A protective film 74 covers the emitter wiring 61. The second opening 32 is in this protective film 74. The second opening 32 is in an area in which the substantially mesa-shaped portion of the HBTs 20 is not present.

The bump 40 is on the protective film 74. The bump 40 includes an under-bump metal layer 41, a metal post 42, and a solder layer 43 stacked in this order from the substrate 50. The under-bump metal layer 41 is made of a high-melting metal, such as Ti or TiW. The metal post 42 is made of, for example, copper (Cu). The solder layer 43 is a layer of a tin (Sn)-containing solder. Having such a multilayer structure, the bump 40 is called a Cu-pillar bump.

In the following, advantages of Embodiment 1 are described by comparing Embodiment 1 with the comparative embodiment illustrated in FIGS. 3 and 4.

Figure 3:
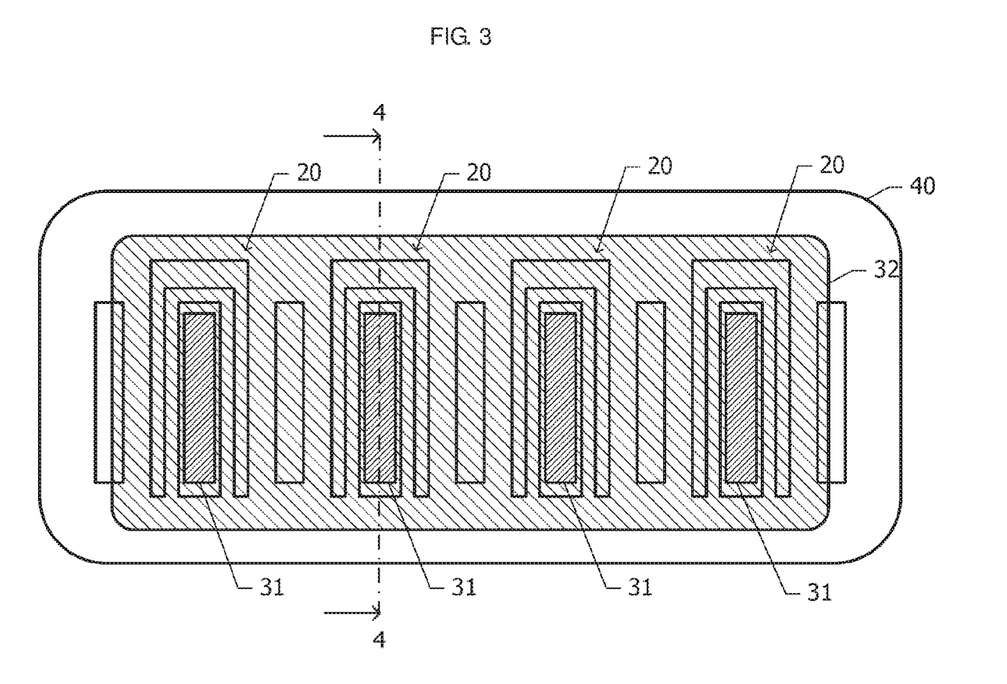
FIG. 3 illustrates the relative positions in plan view of electrodes, a bump, and openings in an insulating film in a semiconductor device according to a comparative embodiment.

FIG. 3 illustrates the relative positions in plan view of electrodes, a bump, and openings in an insulating film in a semiconductor device according to a comparative embodiment. Whereas the second opening 32 in Embodiment 1 does not overlap the first openings 31, the second opening 32 in this comparative embodiment overlaps the first openings 31. For example, the first openings 31 are inside the second opening 32 in plan view. In FIG. 3, the first openings 31 are shaded relatively dark, and the second opening 32 is shaded relatively light.

Figure 4:
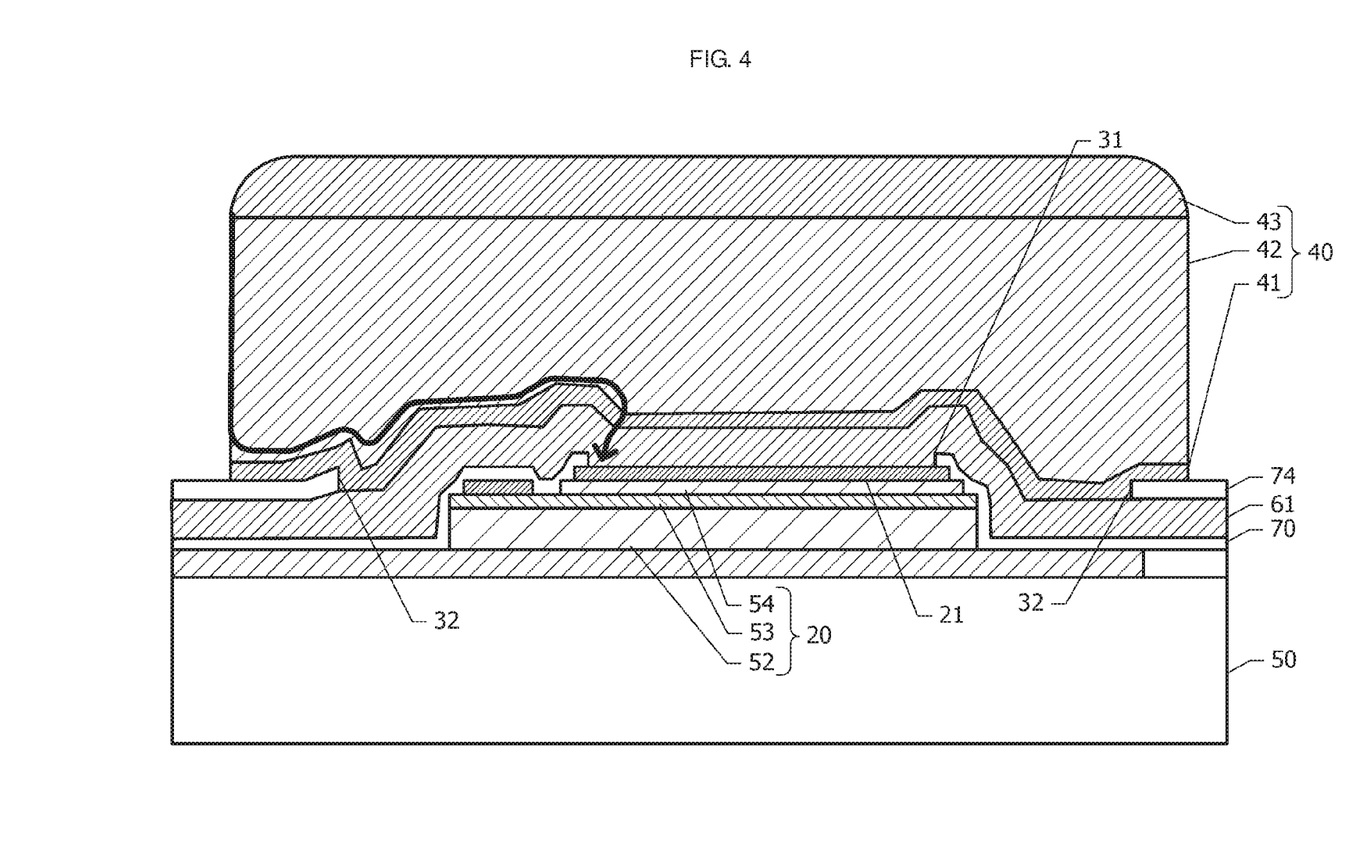
FIG. 4 is a cross-section along dash-dot line IV-IV in FIG. 3.

FIG. 4 is a cross-section along dash-dot line IV-IV in FIG. 3. The first openings 31 are inside the second opening 32.

The comparative embodiment illustrated in FIGS. 3 and 4 have the following disadvantages. In flip-chip bonding, the solder layer 43 is melted. Any excess of molten solder runs down the side of the metal post 42 and reaches the interface between the under-bump metal layer 41 and the metal post 42. The solder that reaches the interface penetrates into the bump 40 by running between the under-bump metal layer 41 and the metal post 42 as indicated by the arrow in FIG. 4.

The under-bump metal layer 41 may have a crack or similar defect caused by the height gap along the edge of the first openings 31. Solder that penetrates into the bump 40 and reaches this crack reaches the emitter wiring 61 by running through the crack. Once solder reaches the emitter wiring 61, the Sn in the solder diffuses inside the emitter wiring 61 while reacting with the Au in the emitter wiring 61. Diffusion of Sn to an emitter electrode 21 and the emitter layer 54 causes damage to or the destruction of the HBT 20. The diffusion of Sn is not limited to flip-chip bonding but can occur when the emitter wiring 61 and the emitter electrodes 21 heat up during the operation of the HBTs 20.

In Embodiment 1, solder can likewise penetrate between the under-bump metal layer 41 and the metal post 42 and come immediately above a first opening 31, but the protective film 74, interposed between the under-bump metal layer 41 and the emitter wiring 61, prevents the solder from entering the emitter wiring 61 as indicated by the arrow in FIG. 2.

In another case, solder that reaches the second opening 32 can penetrate into the emitter wiring 61 by running through a crack in the under-bump metal layer 41 caused by the height gap along the edge of the second opening 32. The second opening 32, however, does not overlap the heat-producing emitter layer 54 or the base layer 53 or collector layer 52 underneath in plan view, and this means the emitter wiring 61 underneath the second opening 32 is unlikely to heat up to high temperatures during the operation of the HBTs 20. The electromigration-driven movement of the Sn that enters the emitter wiring 61 and the reaction of the Sn with Au are therefore slower. In Embodiment 1, therefore, the HBTs 20 are less likely to be damaged or destroyed by the entry of solder. Moreover, since the increased resistance of the emitter wiring 61 caused by the reaction between Sn and Au is less likely, the associated decrease in the electrical performance of the HBTs 20 is smaller. In particular, power transistors, which are transistors that operate with high power, benefit significantly from the configuration of Embodiment 1.

In Embodiment 1, moreover, the second opening 32 does not overlap the substantially mesa-shaped portion of the HBTs 20, and this means the protective film 74 is on a very flat surface in the area in which it has the second opening 32. This leads to another advantage: the under-bump metal layer 41 is less likely to crack.

In Embodiment 1, furthermore, the first openings 31 are inside the bump 40 in plan view. This ensures efficient dissipation of heat through the route from the HBTs 20 to the bump 40 via the first openings 31.

Embodiment 2

Next is described a semiconductor device according to Embodiment 2 with reference to FIGS. 5 to 11. Structural features in common with a semiconductor device according to Embodiment 1 (FIGS. 1 and 2) are not described.

Figure 5:
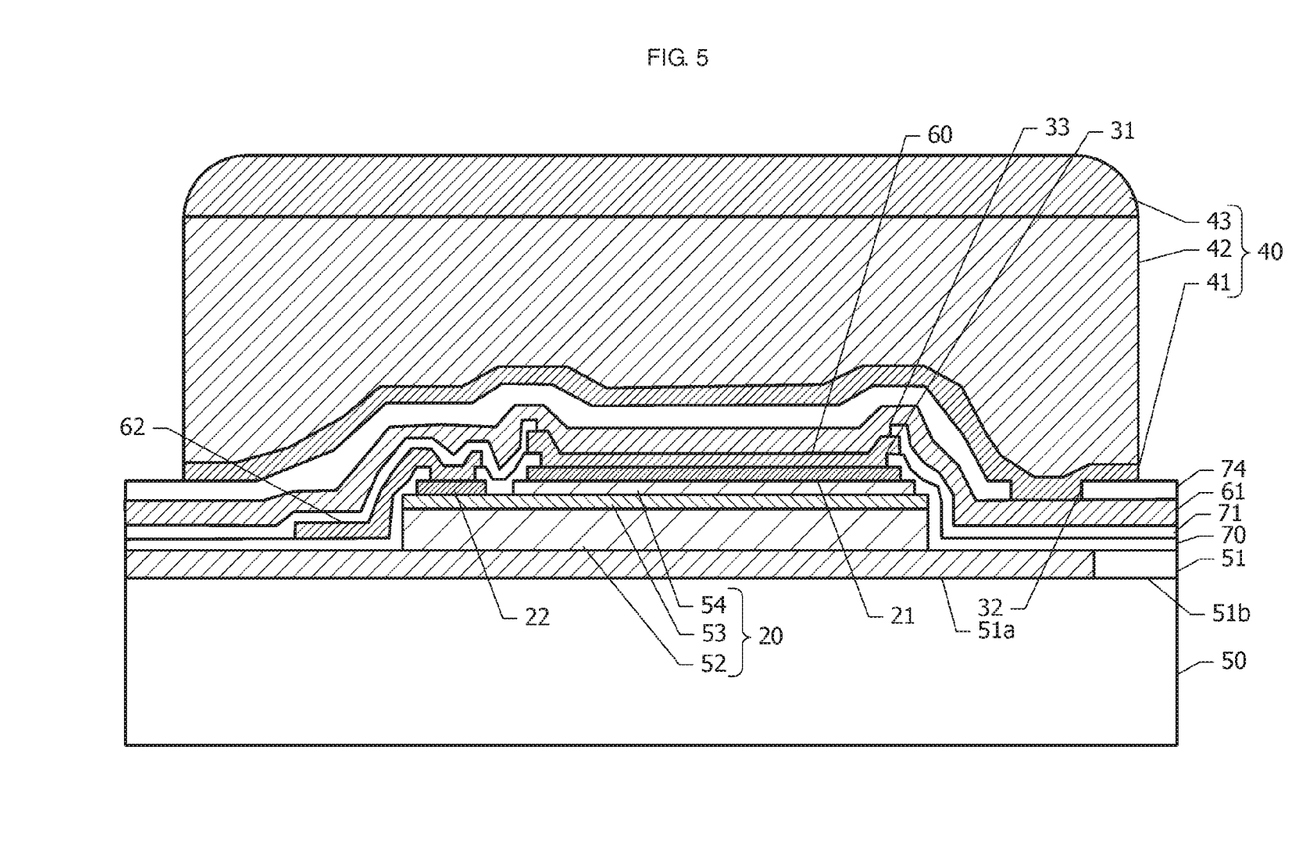
FIG. 5 is a cross-section of a semiconductor device according to Embodiment 2.

FIG. 5 is a cross-section of a semiconductor device according to Embodiment 2. In Embodiment 1, the emitter wiring 61 (FIG. 2) is connected directly to the emitter electrodes 21 by sticking through the first openings 31. In Embodiment 2, there is a first layer 60 of emitter wiring beneath the emitter wiring 61, and this first layer 60 of emitter wiring is connected to the emitter electrodes 21 by sticking through the first openings 31. There is an insulating film 71 on the insulating film 70 and the first layer 60 of emitter wiring. On this insulating film 71 is a second layer 61 of emitter wiring. The second layer 61 of emitter wiring is connected to the first layer 60 of emitter wiring by sticking through third openings 33, openings present in the insulating film 71. The third openings 33 substantially fit the first openings 31 in plan view.

In Embodiment 2, the pathway for the bump 40 to be electrically coupled to the emitter electrodes 21 is formed by the second opening 32, third openings 33, and first openings 31. On the insulating film 70 is base wiring 62. The base wiring 62 is connected to the base electrodes 22 by sticking through openings present in the insulating film 70. The relative positions in plan view of the emitter electrodes 21, base electrodes 22, collector electrodes 23, first openings 31, second opening 32, and bump 40 are the same as in Embodiment 1 (FIG. 1).

Next is described the production of a semiconductor device according to Embodiment 2 with reference to FIGS. 6 to 11. FIGS. 6 to 11 are cross-sections of a semiconductor device according to Embodiment 2 under production. The materials, dimensions, doping concentrations, etc., set forth below for structural elements are only illustrative.

Figure 6:
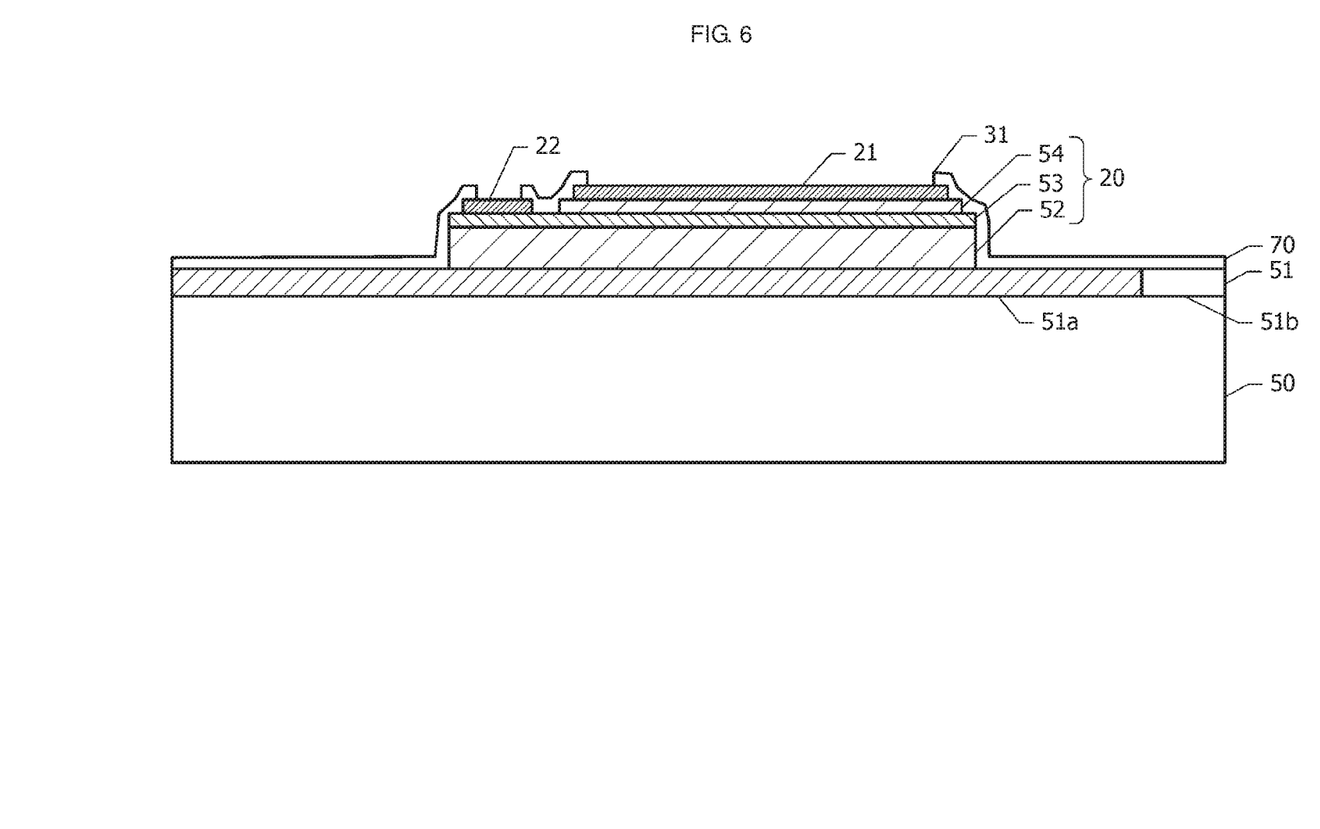
FIG. 6 is a cross-section of a semiconductor device according to Embodiment 2 under production.

As illustrated in FIG. 6, a subcollector layer 51, HBTs 20, emitter electrodes 21, and base electrodes 22 are formed on a semi-insulating GaAs substrate 50. The ordinary semiconductor process is used for this. The element formation region 51a of the subcollector layer 51 is made of heavily doped n-type GaAs and has a thickness of about 0.5 µm. The element isolation region 51b is formed by a process of ion implantation for giving insulation to GaAs.

In each HBT 20, the collector layer 52 is made of n-type GaAs and has a thickness of about 1 µm. The base layer 53 is made of p-type GaAs and has a thickness of about 100 nm. The emitter layer 54 includes a layer of n-type InGaP touching the base layer 53 and an emitter mesa layer thereon. The thickness of the n-type InGaP layer is about 30 nm or more and about 40 nm or less (i.e., from about 30 nm to about 40 nm).

The base electrodes 22 are electrically coupled to the base layer 53.

The emitter mesa layer includes an about 100-nm thick layer of heavily doped n-type GaAs and an about 100-nm thick layer of heavily doped n-type InGaAs thereon. The emitter mesa layer is for establishing an ohmic contact with the emitter electrode 21 lying on it.

The emitter electrodes 21 are made of Ti and have a thickness of about 50 nm. The base electrodes 22 are formed by the three layers of a Ti film, a Pt film, and a Au film stacked in this order from bottom. Although not seen in the cross-section in FIG. 6, there are collector electrodes on the element formation region 51a of the subcollector layer 51. The collector electrodes are formed by the three layers of a AuGe film, a Ni film, and a Au film stacked in this order from bottom.

An insulating film 70 is formed to cover the subcollector layer 51, collector layer 52, base layer 53, emitter layer 54, emitter electrodes 21, and base electrodes 22. The material for the insulating film 70 is SiN. Then the insulating film 70 is perforated with first openings 31, which expose the emitter electrodes 21, and openings that expose the base electrodes 22.

Figure 7:
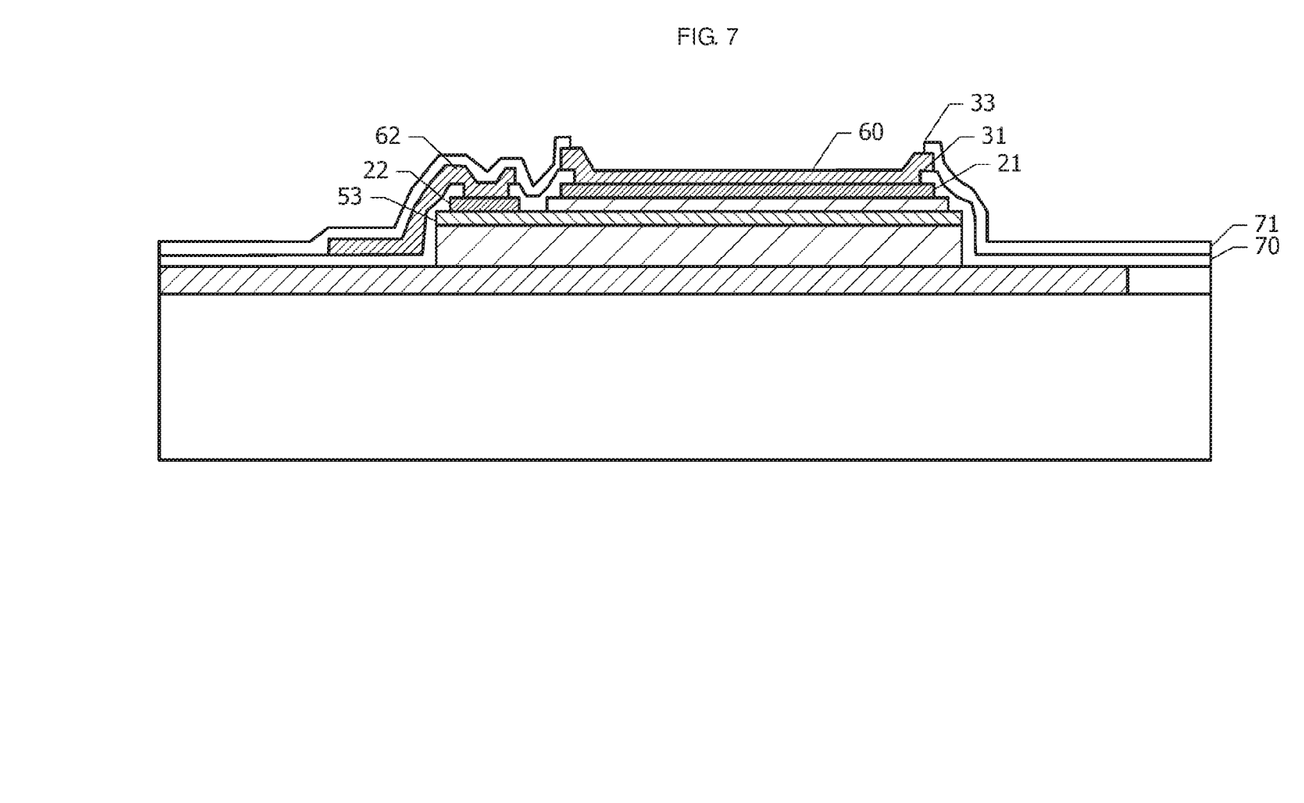
FIG. 7 is a cross-section of a semiconductor device according to Embodiment 2 under production.

As illustrated in FIG. 7, a first layer 60 of emitter wiring is formed on the surface of the emitter electrodes 21 exposed in the first openings 31, and base wiring 62 is formed on the exposed surface of the base electrodes 22. Collector wiring is formed at the same time as the emitter wiring 60 and base wiring 62. The base wiring 62 extends to the outside of the base layer 53 in plan view. The emitter wiring 60 and base wiring 62 are formed by the two layers of a Ti film and a Au film thereon. The thickness of the Ti film is about 10 nm or more and about 50 nm or less (i.e., from about 10 nm to about 50 nm), and that of the Au film is about 1 µm or more and about 2 µm or less (i.e., from about 1 µm to about 2 µm).

An insulating film 71 is formed to cover the insulating film 70, emitter wiring 60, and base wiring 62. The material for the insulating film 71 is SiN. The insulating film 71 is perforated with third openings 33, which expose the emitter wiring 60.

Figure 8:
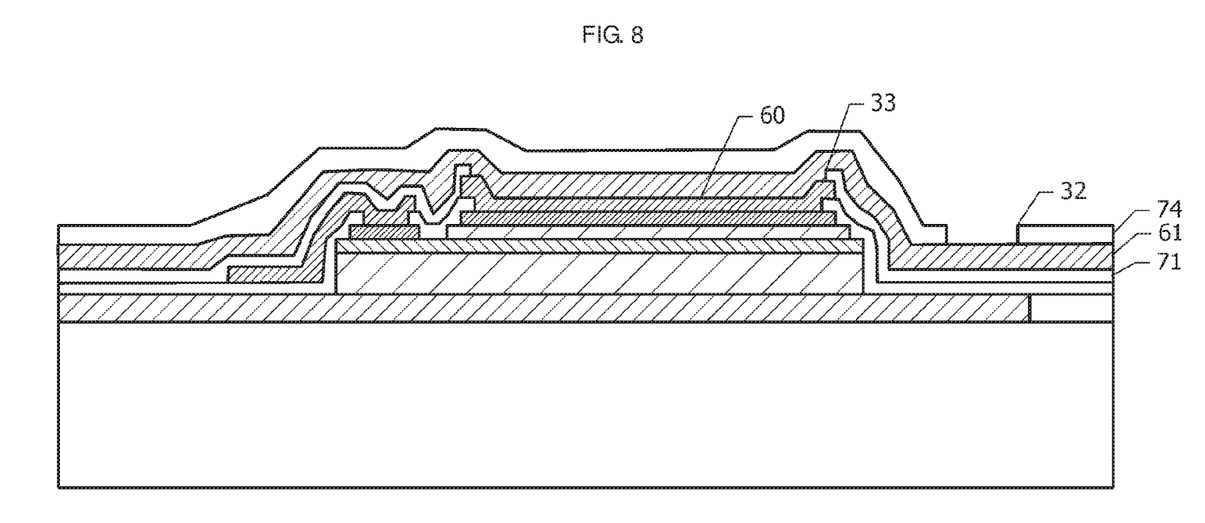
FIG. 8 is a cross-section of a semiconductor device according to Embodiment 2 under production.

As illustrated in FIG. 8, a second layer 61 of emitter wiring is formed on the surface of the emitter wiring 60 exposed in the third openings 33 and on the insulating film 71. The emitter wiring 61 is formed by the two layers of a Ti film and a Au film thereon. The thickness of the Ti film is about 10 nm or more and about 50 nm or less (i.e., from about 10 nm to about 50 nm), and that of the Au film is about 2 µm or more and about 4 µm or less (i.e., from about 2 µm to about 4 µm).

A protective film 74 is formed to cover the emitter wiring 61. The protective film 74 is a single layer of SiN film or has a two-layer structure formed by a SiN film and a resin film. The protective film 74 is perforated with a second opening 32. The emitter wiring 61 becomes exposed in the second opening 32.

Figure 9:
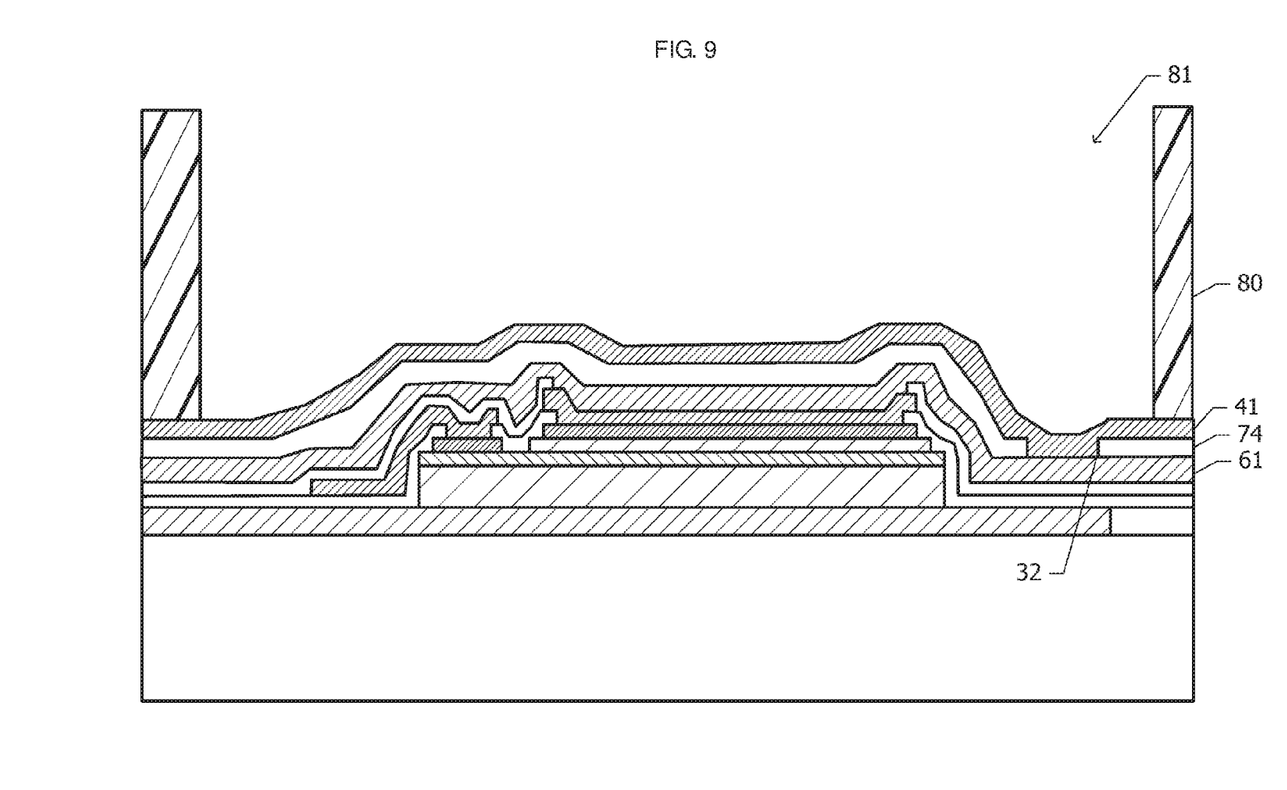
FIG. 9 is a cross-section of a semiconductor device according to Embodiment 2 under production.

As illustrated in FIG. 9, an under-bump metal layer 41 is formed to cover the protective film 74 and the emitter wiring 61 in the second opening 32. The under-bump metal layer 41 is a layer of a high-melting metal, such as Ti, and has a thickness of about 50 nm or more and about 100 nm or less (i.e., from about 50 nm to about 100 nm). On the under-bump metal layer 41, a resist film 80 is formed with an opening 81 in which a bump 40 (FIG. 5) is to be formed. The under-bump metal layer 41 is exposed in the opening 81.

Figure 10:
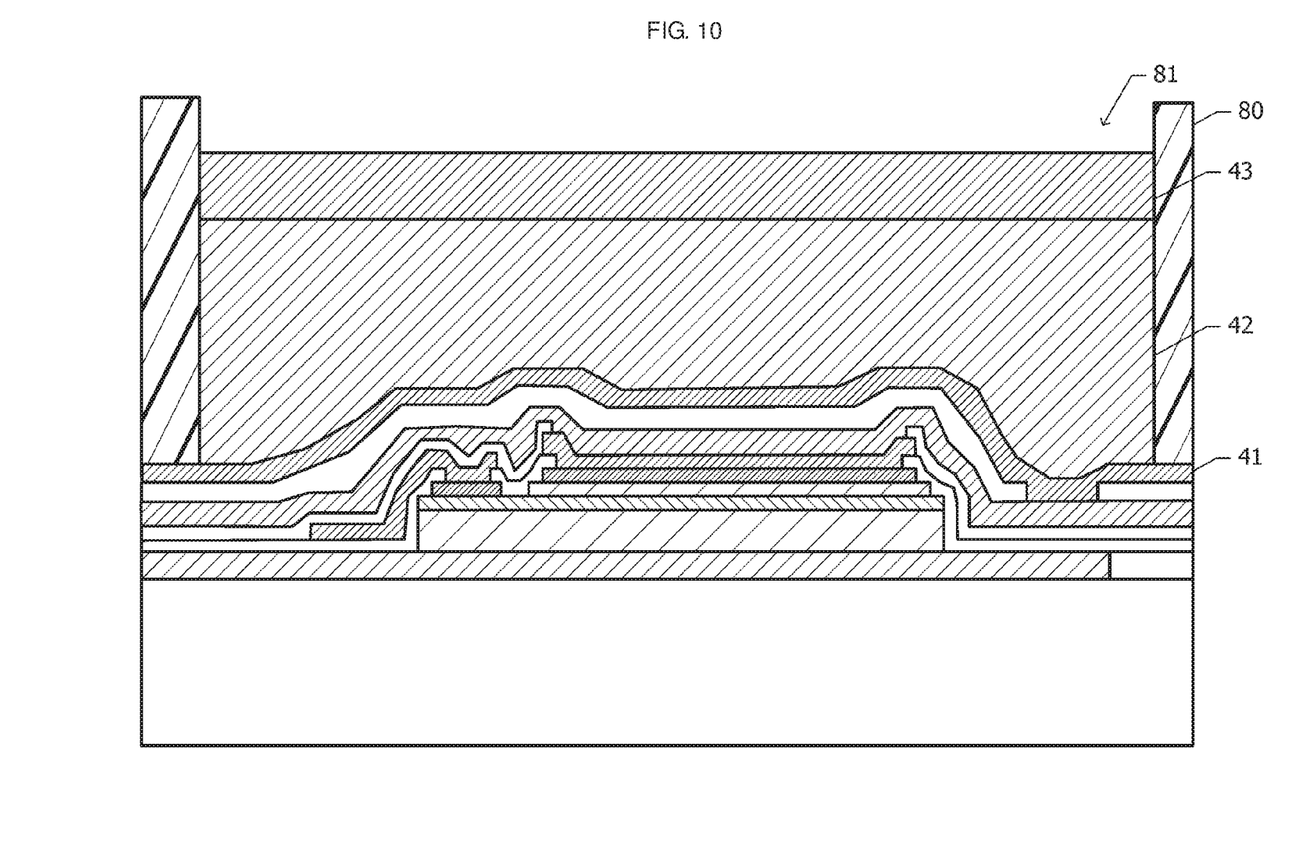
FIG. 10 is a cross-section of a semiconductor device according to Embodiment 2 under production.

As illustrated in FIG. 10, a metal post 42 and a solder layer 43 are deposited by plating on the surface of the under-bump metal layer 41 exposed in the opening 81. The metal post 42 is made of copper (Cu) and has a thickness of about 30 µm or more and about 50 µm or less (i.e., from about 30 µm to about 50 µm). The solder layer 43 is made of tin (Sn) or an alloy of Sn and Ag and has a thickness of about 10 µm or more and about 30 µm or less (i.e., from about 10 µm to about 30 µm). Between the metal post 42 and the solder layer 43, a barrier metal layer, for example a layer of Ni, may be placed to prevent interdiffusion. After the formation of the solder layer 43, the resist film 80 is removed.

Figure 11:
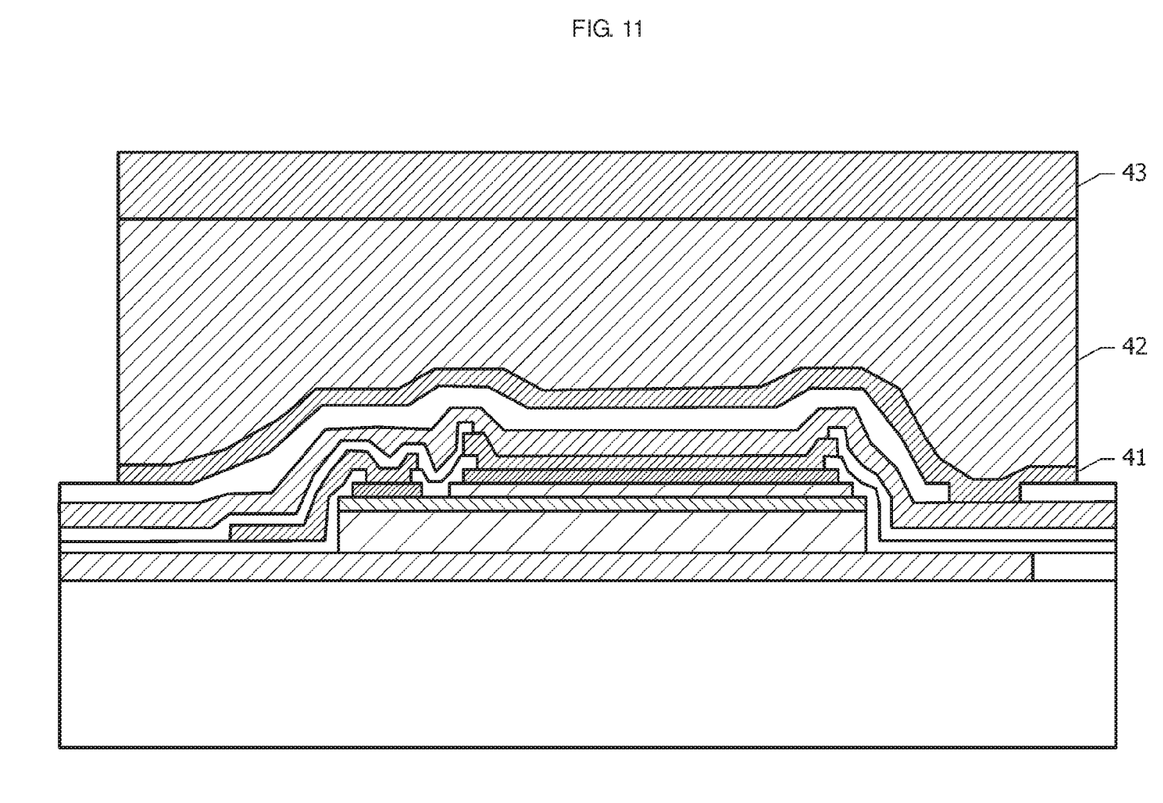
FIG. 11 is a cross-section of a semiconductor device according to Embodiment 2 under production.

As illustrated in FIG. 11, the portion of the under-bump layer 41 covered with the resist film 80 (FIG. 10) is removed. The under-bump metal layer 41 underneath the metal post 42 remains. The solder layer 43 is molten and solidified as in reflow soldering to complete a semiconductor device as illustrated in FIG. 5.

The advantages of Embodiment 2 are as follows. In Embodiment 2(FIG. 5), as in Embodiment 1, the first openings 31 and the second opening 32 do not overlap in plan view, and the device has a protective film 74 between the surface of the emitter electrodes 21 in the first openings 31 and the under-bump metal layer 41. This reduces the risk for damage to or the destruction of the HBTs 20 from the entry of solder. Moreover, the protective film 74 is on a very flat surface in the area in which it has the second opening 32. This leads to, as in Embodiment 1, another advantage: the under-bump metal layer 41 is less likely to crack.

Preferably, the protective film 74 covers the whole inside of the first openings 31 in plan view to more effectively prevent the emitter electrodes 21 from being reached by solder.

Embodiment 3

Figure 12A:
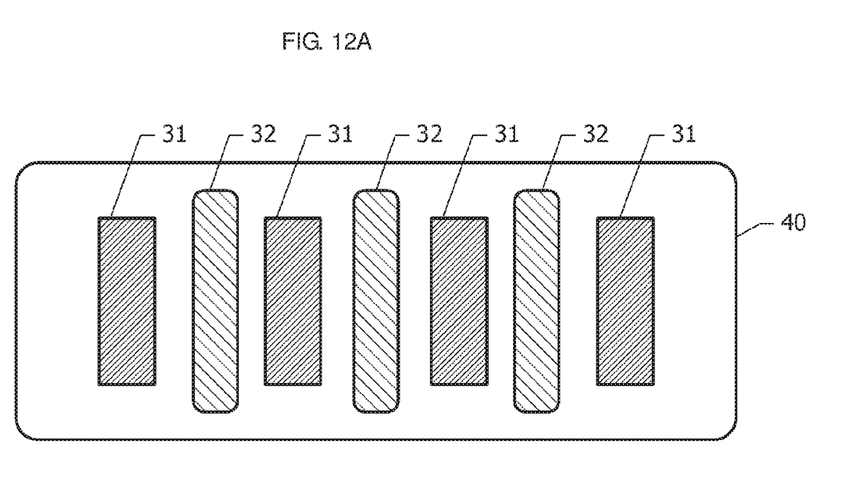
FIGS. 12A and 12B illustrate the relative positions in plan view of first openings, second openings, and a bump in semiconductor devices according to Embodiment 3 and its variation, respectively.

Next is described a semiconductor device according to Embodiment 3 with reference to FIG. 12A. Structural elements in common with a semiconductor device according to Embodiment 1 are not described.

FIG. 12A illustrates the relative positions in plan view of first openings 31, second openings 32, and a bump 40 in a semiconductor device according to Embodiment 3. In Embodiment 1, as illustrated in FIG. 1, the second opening 32 is at a different position from the first openings 31 in the direction perpendicular to the direction of arrangement of the HBTs 20 and is longer in the direction of arrangement in plan view. In Embodiment 3, the second openings 32 are between adjacent first openings 31 and are longer than the first openings 31 in the direction perpendicular to the direction of arrangement of the HBTs 20.

The advantage of Embodiment 3 is as follows.

In Embodiment 3, as in Embodiment 1, the first openings 31 and the second openings 32 do not overlap in plan view, and this reduces the risk for damage to or the destruction of the HBTs 20 from the entry of solder.

Figure 12B:
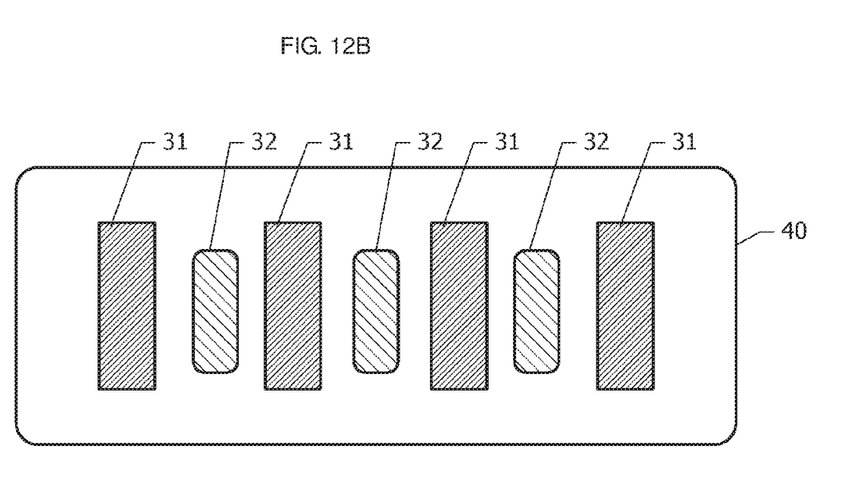

Next is described a semiconductor device according to a variation of Embodiment 3 with reference to FIG. 12B.

FIG. 12B illustrates the relative positions of first openings 31, second openings 32, and a bump 40 in a semiconductor device according to a variation of Embodiment 3. In the variation of Embodiment 3, the second openings 32 are shorter than the first openings 31 in the direction perpendicular to the direction of arrangement of the HBTs 20. The shortest distance from the edge of the bump 40 to the second openings 32 is therefore longer than in Embodiment 3 (FIG. 12A). Moreover, the shortest distance from the edge of the bump 40 to the second openings 32 is longer than that from the edge of the bump 40 to the first openings 31.

By virtue of the second openings 32 being further away from the edge of the bump 40, solder that penetrates from the edge of the bump 40 is less likely to reach the second openings 32. As a result, the damage to or destruction of the HBTs 20 caused by the entry of solder is prevented more effectively.

Embodiment 4

Figure 13:
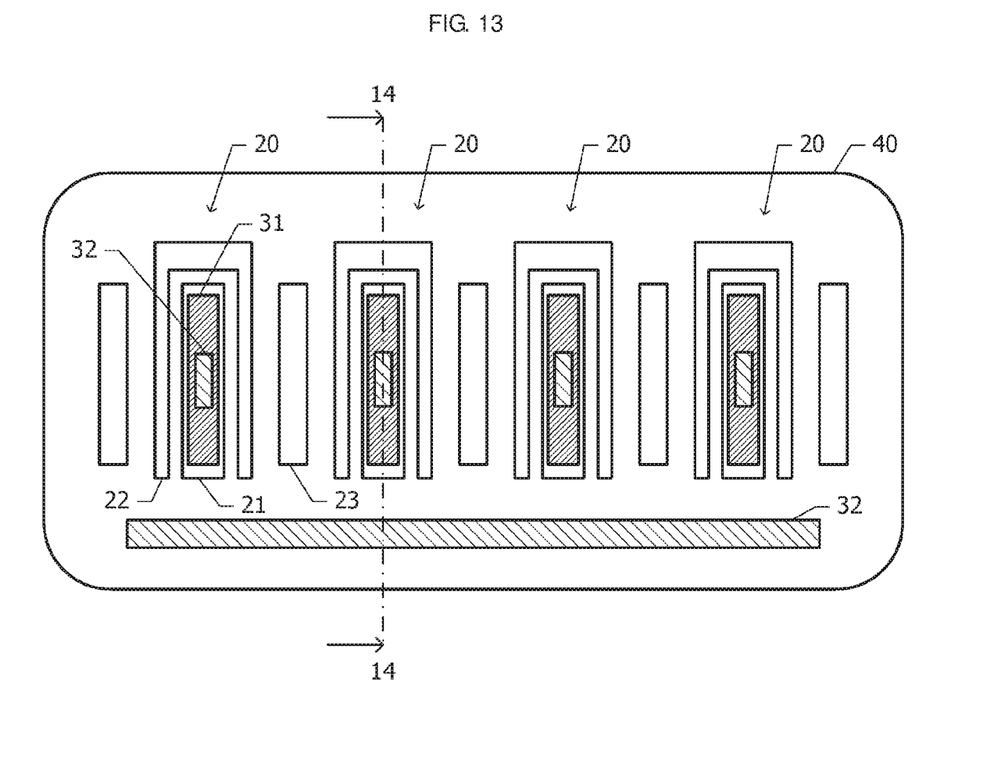
FIG. 13 illustrates the relative positions in plan view of electrodes, a bump, and openings in an insulating film in a semiconductor device according to Embodiment 4.
Figure 14:
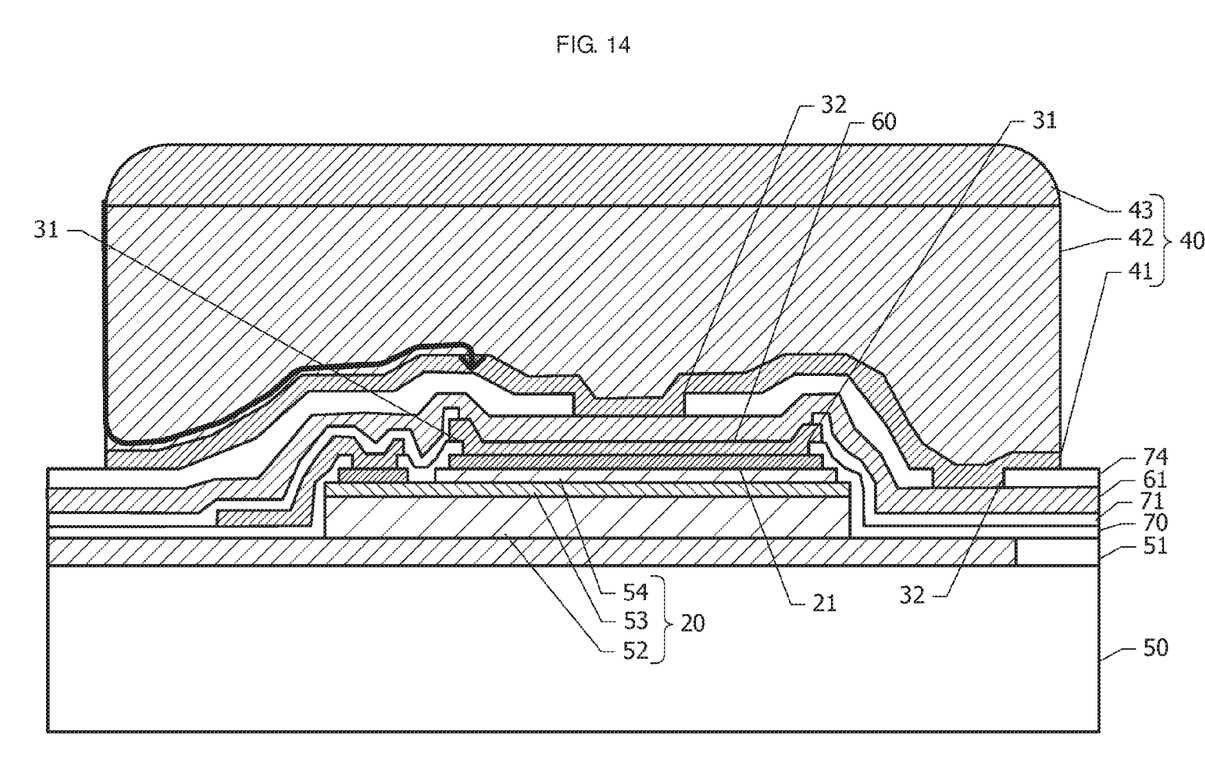
FIG. 14 is a cross-section along dash-dot line XIV-XIV in FIG. 13.

Next is described a semiconductor device according to Embodiment 4 with reference to FIGS. 13 and 14. Structural elements in common with a semiconductor device according to Embodiment 1 or 2 (FIGS. 1, 2, and 5) are not described.

FIG. 13 illustrates the relative positions in plan view of electrodes, a bump, and openings in an insulating film in a semiconductor device according to Embodiment 4. FIG. 14 is a cross-section along dash-dot line XIV-XIV in FIG. 13. In Embodiments 1 and 2, the first openings 31 and the second opening 32 do not overlap in plan view. In Embodiment 4, there are multiple second openings 32 inside a bump 40 in plan view, with some second openings 32 enclosed in the first openings 31. The rest of the second openings 32 is in the area that is inside the bump 40 and outside the first openings 31 in plan view.

The advantages of Embodiment 4 are as follows. In Embodiment 4, some of the second openings 32 overlap the first openings 31, but these second openings 32 are enclosed in the first openings 31. There is a protective film 74 between the edge of the first openings 31 and the under-bump metal layer 41, ensuring that even if solder penetrates into the bump 40 by running between the under-bump layer 41 and the metal post 42 and reaches immediately above the edge of a first opening 31, the solder is blocked by the protective film 74 without reaching the emitter electrode 21 as indicated by the arrow in FIG. 14. It is therefore less likely than in the comparative embodiment illustrated in FIG. 4 that the HBTs 20 are damaged or destroyed by the entry of solder.

Once solder penetrates into the bump 40 and reaches any of the second openings 32 enclosed in the first openings 31, there is a high risk that the solder reaches the emitter electrode 21, for example through a crack in the under-bump metal layer 41. To prevent such solder from reaching an emitter electrode 21, it is preferred that the shortest distance from the edge of the bump 40 to the second openings 32 enclosed in the first openings 31 be at least about 1.5 times that from the edge of the bump 40 to the first openings 31.

In Embodiment 4, moreover, a pathway for heat dissipation is formed between the HBTs 20 and the bump 40 by virtue of the second openings 32 in the first openings 31. A semiconductor device according to Embodiment 4 is therefore superior to those according to Embodiments 1, 2, and 3 in terms of heat dissipation.

Needless to say, the above embodiments are illustrative, and partial replacement or combination of configurations described in different embodiments is possible. For example, semiconductor devices in the above embodiments include HBTs 20, but the HBTs 20 may be replaced with standard bipolar transistors. The bipolar transistors in the above embodiments are on a compound semiconductor substrate, but the technical ideas set forth in the above embodiments are also applicable to bipolar transistors on a silicon substrate. The structure of the bump, moreover, does not need to include a metal post but may be formed by an under-bump layer and a solder layer thereon.

Similar advantages resulting from similar configurations described in different embodiments are not mentioned one by one in each embodiment. No aspect of the present disclosure is limited to the above embodiments. For example, it would be obvious to those skilled in the art that many variations, modifications, combinations, etc., are possible.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
   a substrate;
   a bipolar transistor on the substrate, the bipolar transistor including a stack of a collector layer, a base layer, and an emitter layer;
   an insulating film on the substrate, the insulating film covering the bipolar transistor;
   emitter wiring on the insulating film, the emitter wiring sticking through a first opening in the insulating film to electrically couple to the emitter layer;
   a protective film on the emitter wiring; and
   a bump on the protective film, the bump sticking through at least one second opening in the protective film to electrically couple to the emitter wiring, wherein
   in plan view, the second opening is included in an area that is inside the bump and outside the first opening.

2. The semiconductor device according to claim 1, wherein in plan view, the protective film covers a whole inside of the first opening in plan view.

3. The semiconductor device according to claim 2, wherein in plan view, a shortest distance from an edge of the bump to the second opening is longer than a shortest distance from the edge of the bump to the first opening.

4. The semiconductor device according to claim 3, wherein
   the bipolar transistor includes a substantially mesa-shaped portion present on the substrate, and
   the at least one second opening is outside the substantially mesa-shaped portion in plan view.

5. The semiconductor device according to claim 3, wherein the first opening is inside the bump in plan view.

6. The semiconductor device according to claim 3, wherein
   the protective film has an opening, and
   the opening in the protective film is enclosed in the first opening in plan view.

7. The semiconductor device according to claim 2, wherein
   the bipolar transistor includes a substantially mesa-shaped portion present on the substrate, and
   the at least one second opening is outside the substantially mesa-shaped portion in plan view.

8. The semiconductor device according to claim 7, wherein the first opening is inside the bump in plan view.

9. The semiconductor device according to claim 2, wherein the first opening is inside the bump in plan view.

10. The semiconductor device according to claim 2, wherein
    the protective film has an opening, and
    the opening in the protective film is enclosed in the first opening in plan view.

11. The semiconductor device according to claim 1, wherein in plan view, a shortest distance from an edge of the bump to the second opening is longer than a shortest distance from the edge of the bump to the first opening.

12. The semiconductor device according to claim 11, wherein
    the bipolar transistor includes a substantially mesa-shaped portion present on the substrate, and
    the at least one second opening is outside the substantially mesa-shaped portion in plan view.

13. The semiconductor device according to claim 11, wherein the first opening is inside the bump in plan view.

14. The semiconductor device according to claim 11, wherein
    the protective film has an opening, and
    the opening in the protective film is enclosed in the first opening in plan view.

15. The semiconductor device according to claim 1, wherein
    the bipolar transistor includes a substantially mesa-shaped portion present on the substrate, and
    the at least one second opening is outside the substantially mesa-shaped portion in plan view.

16. The semiconductor device according to claim 15, wherein the first opening is inside the bump in plan view.

17. The semiconductor device according to claim 15, wherein
    the protective film has an opening, and
    the opening in the protective film is enclosed in the first opening in plan view.

18. The semiconductor device according to claim 1, wherein the first opening is inside the bump in plan view.

19. The semiconductor device according to claim 18, wherein
    the protective film has an opening, and
    the opening in the protective film is enclosed in the first opening in plan view.

20. The semiconductor device according to claim 1, wherein
    the protective film has an opening, and
    the opening in the protective film is enclosed in the first opening in plan view.

* * * * *